(12) United States Patent
Hoshino et al.

(10) Patent No.: US 7,692,434 B2
(45) Date of Patent: Apr. 6, 2010

(54) PROBE AND METHOD FOR FABRICATING THE SAME

(75) Inventors: Tomohisa Hoshino, Amagasaki (JP); Yoshiki Yamanishi, Sanda (JP); Hiroyuki Hashimoto, Nishinomiya (JP)

(73) Assignee: Tokyo Electron Limited (JP)

( * ) Notice: Subject to any disclaimer, the term of this patent is extended or adjusted under 35 U.S.C. 154(b) by 163 days.

(21) Appl. No.: 11/665,918

(22) PCT Filed: Oct. 20, 2005

(86) PCT No.: PCT/JP2005/019335
§ 371 (c)(1),
(2), (4) Date: Apr. 20, 2007

(87) PCT Pub. No.: WO2006/043645
PCT Pub. Date: Apr. 27, 2006

(65) Prior Publication Data
US 2008/0001102 A1    Jan. 3, 2008

(30) Foreign Application Priority Data
Oct. 22, 2004 (JP) ............................. 2004-308132

(51) Int. Cl.
*G01R 31/02* (2006.01)
(52) U.S. Cl. ...................... 324/754; 324/757; 324/158.1
(58) Field of Classification Search .................. 850/29, 850/40, 45, 52, 57, 60; 977/855, 856, 857, 977/859; 216/11, 17, 18; 257/780, 781; 324/754, 757, 760, 761, 158.1; 438/612, 438/613, 9, 12–17
See application file for complete search history.

(56) References Cited

U.S. PATENT DOCUMENTS

| 5,786,270 | A | * | 7/1998 | Gorrell et al. ............... 438/613 |
| 5,923,637 | A | * | 7/1999 | Shimada et al. .............. 850/59 |
| 5,929,438 | A | * | 7/1999 | Suzuki et al. ................. 850/50 |
| 6,059,982 | A | * | 5/2000 | Palagonia et al. ............. 216/11 |
| 6,072,321 | A | * | 6/2000 | Akram et al. ............... 324/754 |
| 6,100,708 | A |   | 8/2000 | Mizuta |

(Continued)

FOREIGN PATENT DOCUMENTS

JP    7-50323    2/1995

(Continued)

OTHER PUBLICATIONS

Japanese Office Action dated Sep. 8, 2009.

(Continued)

*Primary Examiner*—Jack I Berman
*Assistant Examiner*—Brooke Purinton
(74) *Attorney, Agent, or Firm*—Finnegan, Henderson, Farabow, Garrett & Dunner, LLP (57) ABSTRACT

A probe needle 20 includes a cantilever 21, a column 22 and a tip 23. The column 22 is cantilevered from an end of the cantilever 21. The tip 23 is formed on a top end of the column 22. The column 22 is formed so as to be longer than the tip 23. The heights of the column 22 and tip 23 are chosen so that their sum is twice or more than twice the width of the columnar 22.

6 Claims, 5 Drawing Sheets

U.S. PATENT DOCUMENTS

| | | | |
|---|---|---|---|
| 6,218,264 B1 * | 4/2001 | Bartha et al. | 216/11 |
| 6,268,015 B1 * | 7/2001 | Mathieu et al. | 430/313 |
| 6,280,647 B1 * | 8/2001 | Muramatsu et al. | 850/57 |
| 6,344,752 B1 * | 2/2002 | Hagihara et al. | 324/754 |
| 6,616,966 B2 * | 9/2003 | Mathieu et al. | 29/842 |
| 7,063,541 B2 * | 6/2006 | Grube et al. | 439/66 |
| 7,081,624 B2 * | 7/2006 | Liu et al. | 250/306 |
| 7,279,917 B2 * | 10/2007 | Williams et al. | 324/762 |
| 7,300,860 B2 * | 11/2007 | Dubin | 977/847 |
| 7,344,756 B2 * | 3/2008 | Mirkin et al. | 977/860 |
| 7,371,072 B2 * | 5/2008 | Mathieu et al. | 439/66 |
| 7,482,822 B2 * | 1/2009 | Cooper et al. | 324/754 |
| 7,553,165 B2 | 6/2009 | Mathieu et al. | |
| 2001/0026166 A1 * | 10/2001 | Khoury et al. | 324/754 |
| 2002/0008530 A1 * | 1/2002 | Kim et al. | 324/754 |
| 2002/0105076 A1 * | 8/2002 | Lin | 257/738 |
| 2005/0110157 A1 * | 5/2005 | Sherrer et al. | 257/776 |
| 2008/0254651 A1 | 10/2008 | Mathieu et al. | |
| 2009/0263986 A1 | 10/2009 | Mathieu et al. | |

FOREIGN PATENT DOCUMENTS

| | | |
|---|---|---|
| JP | 11-101820 | 4/1999 |
| JP | 11-101820 A | 4/1999 |
| JP | 2000-55936 | 2/2000 |
| JP | 2000-74941 | 3/2000 |
| JP | 2000-105184 | 4/2000 |
| JP | 2000-227444 | 8/2000 |
| JP | 2001-57378 | 2/2001 |
| JP | 2001-147240 | 5/2001 |
| JP | 2002-148817 | 5/2002 |
| JP | 2004-186670 | 7/2004 |
| JP | 2004-186670 A | 7/2004 |
| KR | 2003-50992 | 6/2003 |
| WO | WO97/43653 | 11/1997 |
| WO | WO 00/33089 A2 | 6/2000 |
| WO | WO 00/33089 A3 | 6/2000 |

OTHER PUBLICATIONS

Communication from the Japanese Patent Office dated Sep. 8, 2009 in Japanese Patent Application No. 2004-308132, files Aug. 31, 2009 (3 pages).

* cited by examiner

PROBE AND METHOD FOR FABRICATING THE SAME

TECHNICAL FIELD

The present invention relates to probes and methods for manufacturing the probes, and for example to a probe for use in testing the electrical characteristics of semiconductor wafers and a method for fabricating the probe.

BACKGROUND ART

In order to test the electrical characteristics of IC chips consisting of a great number of memory circuits, logic circuits and the other components formed on a semiconductor wafer, a probe card as disclosed in Japanese unexamined patent publication No. 2000-055936 is used as a contactor, for example. This probe card plays a role in relaying test signals that are sent and received between a tester, which is test equipment, and an IC chip upon the probe card makes contact with an electrode pad on the wafer during the test.

This probe card, for example, has a plurality of probe needles corresponding to a plurality of electrode pads formed on an IC chip, and each of the probe needles is brought into electrical contact with each of the electrode pads to perform a test of the IC chip. The probe needle includes a tip for making contact with the electrode pad and a cantilever made of a resilient member.

Figure 6A:
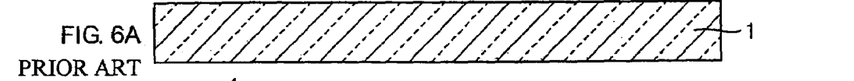
FIG. 6A illustrates a conventional fabrication process of a probe needle, and shows a silicon substrate.
Figure 6B:
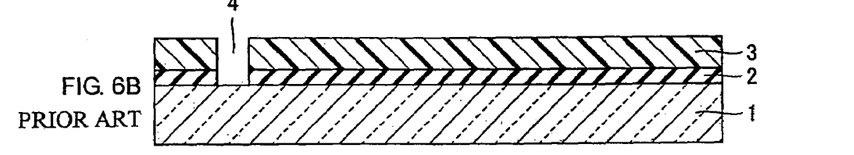
FIG. 6B illustrates the conventional fabrication process of the probe needle, and shows that a silicon dioxide film and resist film are formed on the silicon substrate.
Figure 6C:
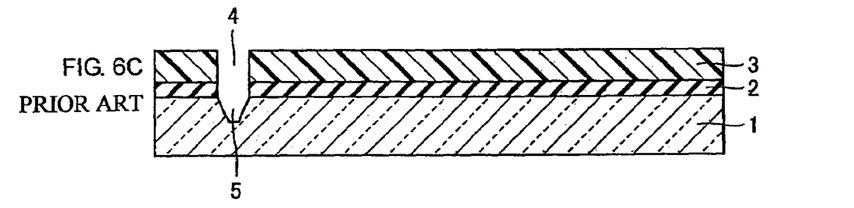
FIG. 6C illustrates the conventional fabrication process of the probe needle, and shows that an inverted truncated pyramidal groove is formed in the silicon substrate.
Figure 6D:
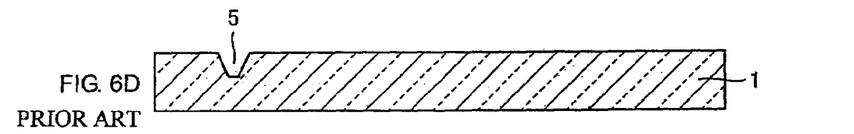
FIG. 6D illustrates the conventional fabrication process of the probe needle, and shows that the resist film and silicon dioxide film are removed from the silicon substrate.
Figure 6E:
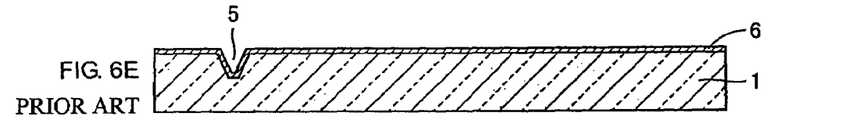
FIG. 6E illustrates the conventional fabrication process of the probe needle, and shows that a titanium film is formed on the silicon substrate.
Figure 6F:
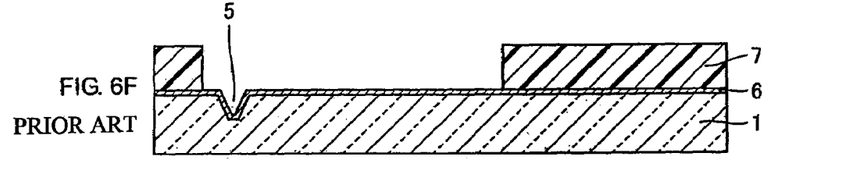
FIG. 6F illustrates the conventional fabrication process of the probe needle, and shows that a sacrificial layer is formed on the titanium film.
Figure 6G:
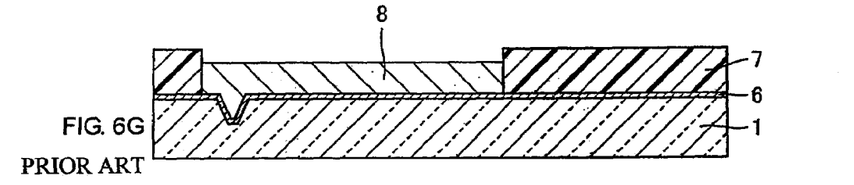
FIG. 6G illustrates the conventional fabrication process of the probe needle, and shows that an area corresponding to a cantilever and the groove are plated.
Figure 6H:
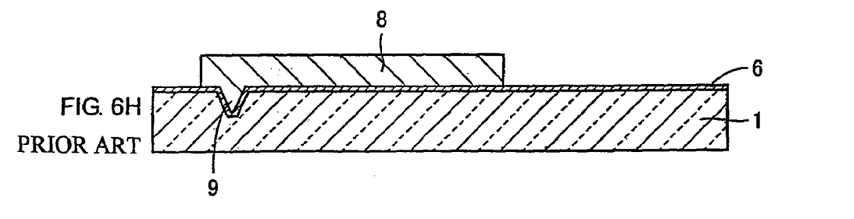
FIG. 6H illustrates the conventional fabrication process of the probe needle, and shows that the sacrificial layer is removed.
Figure 7:
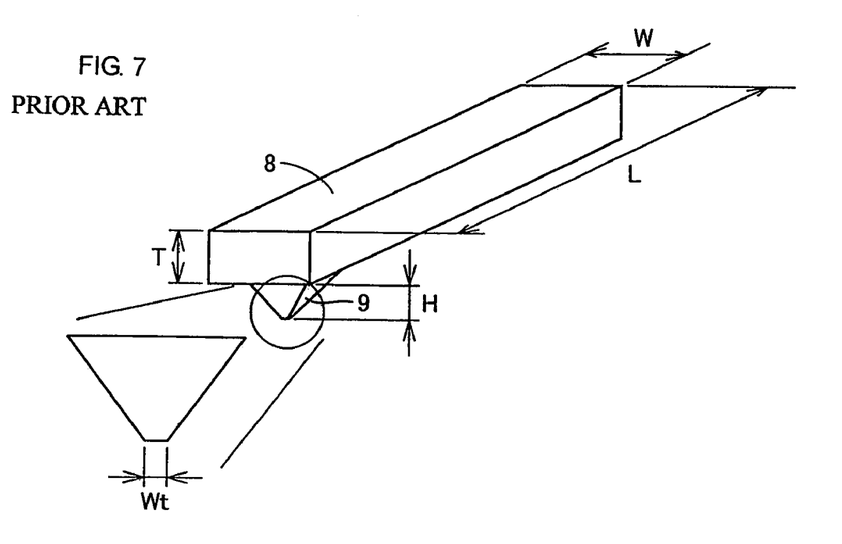
FIG. 7 is an external perspective view of the probe needle fabricated through the fabrication process shown in FIGS. 6A to 6H.

FIGS. 6A to 6H show a fabrication process of the probe needle, while FIG. 7 is an external perspective view of the probe needle fabricated through the fabrication process of FIGS. 6A to 6H. Referring to FIGS. 6A to 6H and FIG. 7, a description now will be made about a conventional probe needle.

On a surface of a silicon substrate 1 shown in FIG. 6A, a silicon dioxide film 2 is formed as shown in FIG. 6B, and then a resist film 3 is formed on a surface of the silicon dioxide film 2. After being exposed to light with a photomask (not shown), the resist film 3 undergoes a development process to form a quadrangular opening groove 4. The silicon dioxide film 2 just under the opening groove 4 is then removed. After an inverted truncated pyramidal groove 5 is formed by anisotropically wet-etching the silicon substrate 1 as shown in FIG. 6C, the resist film 3 and silicon dioxide film 2 are removed as shown in FIG. 6D.

Further, as shown in FIG. 6E, a titanium film 6, which will be a plating seed, is formed over the entire surface of the silicon substrate 1. Next, a sacrificial layer 7 shown in FIG. 6F is formed by means of a photolithography technique on the titanium film 6 except for an area to be a cantilever 8 and groove 5. Then, as shown in FIG. 6G, a nickel alloy, for example, is deposited, by plating, in the area corresponding to the cantilever 8 and groove 5 but not on the sacrificial layer 7. As shown in FIG. 6H, the sacrificial layer 7 is removed to complete an inverted truncated pyramid 9, which is the tip of the probe needle, and a cantilever 8.

The probe formed through the fabrication process shown in FIGS. 6A to 6H has the rectangular parallelepiped cantilever 8, for example, having a length L of 200 µm to 500 µm, a width W of 60 µm to 150 µm, and a thickness T of 10 µm to 20 µm, and the inverted truncated pyramidal tip 9 having a height H of 50 µm to 100 µm and a width Wt at its top flat part of 10 µm±2 µm, as shown in FIG. 7.

By the way, with the recent increase in the number of components per IC chip, the number of electrode pads has increased and the arrangement pitch of the electrode pads are becoming narrower and narrower. Because of this, the probe needle may touch adjoining electrode pads unless the width of the probe needle is reduced, and it can be said that the probe needle has not been meeting the pitch of the electrode pads. However, reduction of the width of the inverted truncated pyramid 9, which is a tip of the probe needle shown in FIG. 7, requires reduction of its height.

In other words, because the inverted truncated pyramid 9 is formed using the groove 5 that is formed by the anisotropic wet etching as shown in FIG. 6C, the more the diameter of the groove 5 is decreased, the shallower the depth of the groove 5 becomes. On the contrary, in order to deepen the groove 5, the diameter of the groove 5 must be increased, resulting in an increase in diameter of the tip. Such a tip is not applicable to the tendency to narrow the pitch between the electrode pads.

As described above, a height-reduced inverted truncated pyramid 9 may cause the cantilever 8 to touch the electrode pads and other components or may prevent itself from appropriately making contact with the electrode pads. In addition, the short inverted truncated pyramid 9 may cause the cantilever 8 to bend and thus touch the electrode pads.

DISCLOSURE OF THE INVENTION

It is, therefore, an object of the present invention to provide a probe capable of reliably making contact with electrode pads arranged at a narrow pitch, and a method for fabricating the probe.

In a probe including a beam cantilevered from a probe substrate and a contact raised and extending from an end of the beam, this invention is characterized in that where the width of a contact's bottom base, which is a junction area with the beam, is W and the height of the contact from the bottom base to the top end is H, the dimensional relationship expressed by $H/W \geqq 2$ is established.

Since the height of the contact from the bottom base to the top end is twice or more than twice the width of the bottom base, the contact can be prevented from making contact with the other components and can reliably make contact with the electrode pads arranged at a narrow pitch.

Preferably, the contact includes a columnar portion raised and extending from the bottom base and a tip portion extending from the top end of the columnar portion in the conical or pyramidal shape. The height of the columnar portion is greater than that of the conical or pyramidal tip portion.

Preferably, transverse sections of the columnar portion are identical in size throughout its height. The columnar portion having the identical transverse sections in size can be formed in a single etching process, thereby simplifying the fabrication process.

Preferably, the columnar portion includes a larger-diameter portion, which is positioned on the bottom base side and relatively large in width, and a smaller-diameter portion, which is positioned on the top end side and relatively small in width. Since the tip portion is formed on the top end of the smaller-diameter portion, the diameter of the tip portion can be even smaller.

Preferably, the top end of the columnar portion and the bottom base of the conical or pyramidal tip portion have the same transverse section in size. Making their transverse sections identical facilitates the fabrication.

Preferably, the bottom base of the contact has a width W of 100 µm or less.

Another aspect of the present invention includes a step of forming a columnar groove by anisotropically dry-etching the main surface of a substrate, a step of forming a conical or pyramidal groove by anisotropically wet-etching the bottom of the columnar groove, and a step of forming a contact of a probe by filling the conical or pyramidal groove and columnar groove with metal.

The adoption of such a fabrication process facilitates fabrication of the probe.

Preferably, the substrate includes a first substrate-material layer and a second substrate-material layer laminated with a boundary layer, which has a different etching rate, interposed therebetween. The columnar groove is formed in the first substrate-material layer, while the conical or pyramidal groove is formed in the second substrate-material layer. The use of the boundary layer having a different etching rate can prevent the second substrate-material layer from being anisotropically dry-etched in succession to the first substrate-material layer.

Preferably, the boundary layer functions as an etching stopper upon the formation of the columnar groove.

Preferably, the step of forming the contact includes a step of forming a plating seed on the walls of the columnar groove and the bottom of the conical or pyramidal groove, and subsequently depositing metal on the seed.

Preferably, the step of forming the columnar groove includes a step of forming a larger-diameter columnar groove, which has a relatively large diameter, by anisotropically dry-etching the main surface of the substrate, and a step of forming a smaller-diameter columnar groove, which has a relatively small diameter, by anisotropically dry-etching the bottom of the larger-diameter columnar groove.

Preferably, the step of forming the columnar groove includes a step of forming a conical or pyramidal inclined surface by anisotropic wet etching on an area for connecting the walls of the smaller-diameter columnar groove and the walls of the larger-diameter columnar groove.

In the present invention, the contact having the height from the bottom base to the top end that is twice or more than twice the width can reliably make contact with the electrode pads arranged at a narrow pitch without touching the other components. In addition, even if a plurality of arrays of the electrode pads are arranged at a narrow pitch, the probe can be arranged on a probe card according to the arrangement of the electrode pads, thereby realizing a more flexible arrangement. Further, even if the beam is bent, the contact that is formed long can prevent the beam from touching the electrode pads or the like.

BEST MODE FOR CARRYING OUT THE INVENTION

Figure 1:
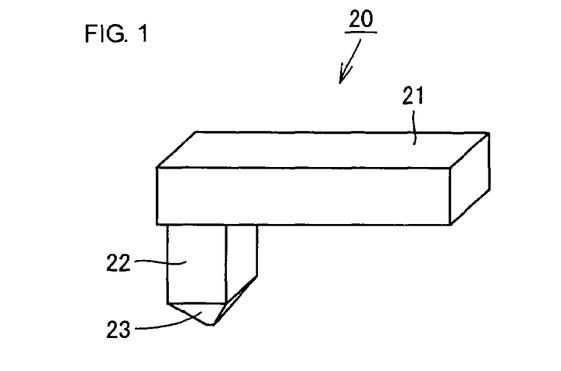
FIG. 1 is an external perspective view of a probe needle according to one embodiment of the invention.
Figure 2A:
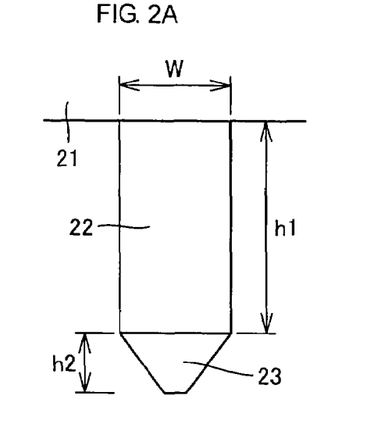
FIG. 2A is an enlarged front view of a column and a tip of the probe needle shown in FIG. 1.
Figure 2B:
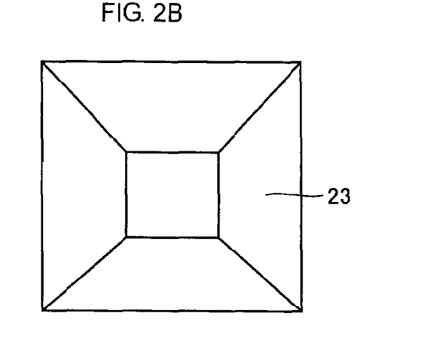
FIG. 2B illustrates an enlarged tip of the probe needle shown in FIG. 1 as viewed from below.

FIG. 1 is an external perspective view of a probe needle according to one embodiment of the invention. FIGS. 2A and 2B are enlarged views of the probe needle shown in FIG. 1; particularly FIG. 2A is a front view of a column and a tip; and FIG. 2B shows the tip as viewed from below.

In FIG. 1, a probe needle 20 includes a cantilever 21 serving as a beam, and a column 22 and a tip 23 serving as a contact, which is raised and extending from an end of the cantilever 21. The column 22 is formed on one end of the cantilever 21 which is cantilevered from a probe base and has a top end with the tip 23 formed thereon. The column 22, as shown in FIG. 2A, is formed in the shape of a quadrangular prism, and has a height h1 of a few tens to a few hundreds of micrometers, more preferably approximately 50 µm to 200 µm, and has a bottom base, which is a junction area with the cantilever 21, having a width W of a few tens of micrometers, more preferably approximately 50 µm.

The tip 23 takes the shape of an inverted truncated pyramid having a height h2 of approximately 30 µm. Specifically, the heights h1 and h2 and width W are chosen so that the height h1 of the column 22 is greater than the height h2 of the tip 23, and further, that where H is a sum of the heights of the column 22 and tip 23, namely h1+h2=H, the dimensional relationship expressed by $H/W \geq 2$ is established. In addition, the transverse sectional area of the column 22 is as approximately the same as that of a junction area of the tip 23 with the column 22.

The tip 23 that is formed in a pyramidal shape has a quadrangular flat surface, approximately 10 µm on a side, at its top end as shown in FIG. 2B. This flat surface is formed to enlarge the contact area with the electrode pad and plays a role in reducing resistance component and facilitating current flow when the tip 23 makes contact with the electrode pad.

By thus reducing the size of the tip 23, the tip 23 does not touch the adjoining electrode pads even if the pitch of the pads becomes narrower. Further, since the tip 23 is put on the column 22 to increase the distance from the cantilever 21, even if the height h2 of the tip 23 is decreased with reduction of the size of the inverted truncated pyramidal tip 23, the possible contact with the electrode pad due to the deformation of the cantilever 21 can be avoided.

In conclusion, the probe according to this embodiment can be made with a relatively simple structure and includes the contact whose heights h1+h2 can be increased as the width W is decreased. Therefore, even if a plurality of arrays of the electrode pads are arranged at a narrow pitch, the probe can be arranged on a probe card according to the arrangement of the electrode pads, thereby realizing a more flexible arrangement.

The column 22 shown in FIG. 1 is a quadrangular prism, while the tip 23 is an inverted truncated pyramid, but they are not limited to these shapes. The column 22 can be formed in the shape of a cylindrical column, triangular prism, or polygonal prism. The tip 23 can be formed in the shape of an inverted truncated circular cone, inverted truncated triangular pyramid or inverted truncated polygonal pyramid according to the shape of the column 22.

Figure 3A:
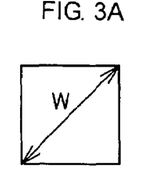
FIG. 3A illustrates a tip of square cross-section of a probe needle, as an example.
Figure 3B:
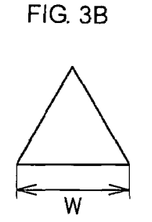
FIG. 3B illustrates a tip of triangular cross-section of a probe needle, as an example.
Figure 3C:
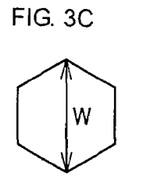
FIG. 3C illustrates a tip of polygonal cross-section of a probe needle, as an example.
Figure 3D:
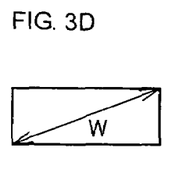
FIG. 3D illustrates a tip of rectangular cross-section of a probe needle, as an example.
Figure 3E:
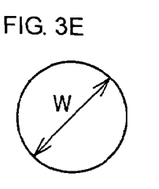
FIG. 3E illustrates a tip of circular cross-section of a probe needle, as an example.

FIGS. 3A to 3E are transverse sectional views showing the various shapes of the column as examples. FIG. 3A shows the column 22 in the shape of a quadrangular prism, as an example, and the width W corresponds to the diagonal line which is the longest part of it. FIG. 3B shows the column 22 in the shape of a triangular prism, and the width W corresponds to the length of a side which is the longest part of it. FIG. 3C shows a column 22 in the shape of a polygonal prism, and the width W corresponds to the diagonal line which is the longest part of it. FIG. 3D shows a column 22 in the shape of a rectangular prism, and the width W corresponds to the diagonal line which is the longest part of it. FIG. 3E shows a column 22 in the shape of a cylindrical column, and the width W corresponds to the diameter.

FIGS. 4A to 4F illustrate a fabrication process of the probe needle 20 shown in FIG. 1. This embodiment of the invention uses a substrate having a double-layer structure, formed by laminating substrate materials with a boundary layer having a different etching rate, interposed therebetween. The main surface of the first substrate-material layer is anisotropically dry-etched to form a groove in the shape of a quadrangular prism corresponding to the column 22, and the second substrate-material layer is anisotropically wet-etched to form a groove corresponding to the tip 23 in the shape of an inverted truncated pyramid. By plating the thus formed grooves, a column 22 and tip 23 are completed. The substrate is formed by bonding a substrate material that includes a silicon dioxide film previously formed on the upper and lower surfaces of a silicon layer, and a substrate material that includes a silicon dioxide film formed on only the upper surface of a silicon layer.

Figure 4A:
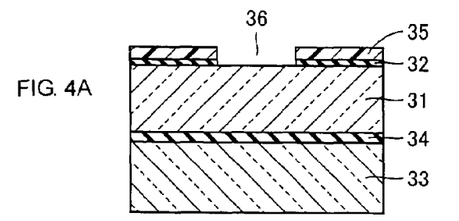
FIG. 4A illustrates a fabrication process of the probe needle shown in FIG. 1, and shows that an NSG film and resist film are formed on one of the silicon substrates with a buried insulating layer interposed therebetween.
Figure 4B:
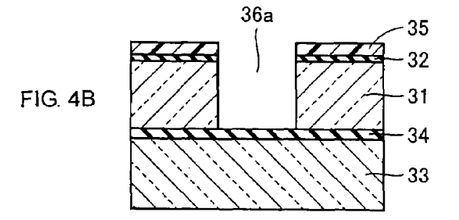
FIG. 4B illustrates the fabrication process of the probe needle shown in FIG. 1, and shows that a columnar groove is formed in the silicon substrate.
Figure 4C:
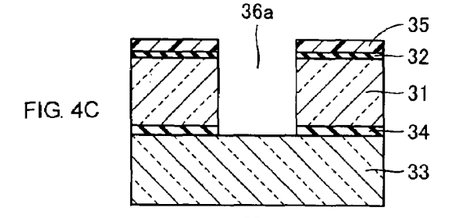
FIG. 4C illustrates the fabrication process of the probe needle shown in FIG. 1, and shows that the buried insulating layer just under the columnar groove is dry-etched to expose a surface of another silicon substrate.
Figure 4D:
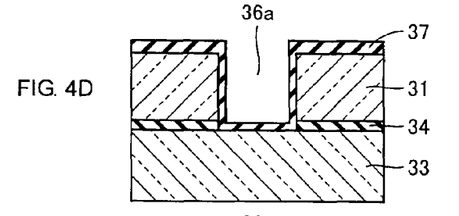
FIG. 4D illustrates the fabrication process of the probe needle shown in FIG. 1, and shows that an oxide film is formed in the columnar groove.

More specifically speaking, as shown in FIG. 4A, an NSG (nondoped silicon dioxide film) film 32 is formed on a silicon substrate 31, which is the first substrate material layer. A buried insulating layer 34, which serves as a boundary layer having a different etching rate, is formed by a CVD method between the silicon substrate 31 and a silicon substrate 33, which is the second substrate-material layer. The buried insulating layer 34 is employed to function as a stopper when the anisotropic dry etching is performed to the silicon substrate 31, and therefore a silicon dioxide film is typically used, however a silicon nitride film can be also used instead of the oxide film. A resist film 35 is formed on the NSG film 32. After being exposed to light with a photomask, the resist film 35 undergoes a development process. Then a quadrangular opening is formed in the resist film 35, subsequently an opening 36 is formed by anisotropic dry etching in the NSG film 32. Further, as shown in FIG. 4B, a deep columnar groove 36a is formed in the silicon substrate 31 so as to extend downward from the opening 36 until the surface of the buried insulating layer 34 is exposed. Furthermore, as shown in FIG. 4C, the buried insulating layer 34 underneath the columnar groove 36a is dry-etched to expose the surface of the silicon substrate 33. After the resist film 35 is removed, an oxide film 37 is formed over the entire surface of the substrate and the walls and bottom of the columnar groove 36a, as shown in FIG. 4D. At this time, the NSG film 32 shown in FIG. 4C is absorbed in the oxide film 37, and thereby the oxide film 37, positioned on the upper surface of the substrate and around the opening of the columnar groove 36a, becomes thicker in comparison with the oxide film 37 on the walls of the columnar groove 36a.

Figure 4E:
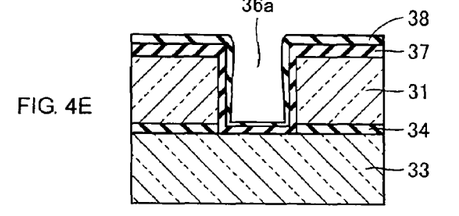
FIG. 4E illustrates the fabrication process of the probe needle shown in FIG. 1, and shows that an NSG film is formed on the bottom of the columnar groove.
Figure 4F:
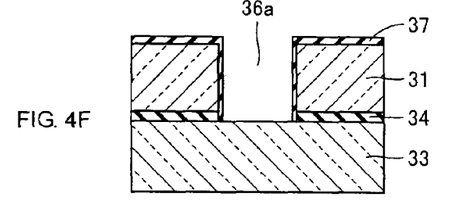
FIG. 4F illustrates the fabrication process of the probe needle shown in FIG. 1, and shows that the silicon substrate just under the columnar groove is exposed.
Figure 4G:
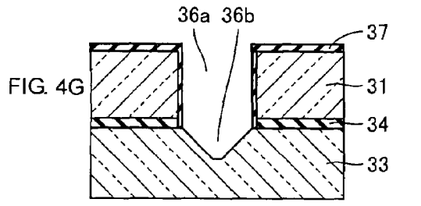
FIG. 4G illustrates the fabrication process of the probe needle shown in FIG. 1, and shows that a pyramidal groove is formed at the bottom of the columnar groove.

As shown in FIG. 4E, an NSG film 38 is formed by a CVD method so as to be relatively thicker on the oxide film 37 positioned on the silicon substrate 31 and thinner on the oxide film 37 positioned on the bottom of the columnar groove 36a. Subsequently, by performing the anisotropic dry etching, the oxide film 37 on the walls of the columnar groove 36a is thinned and the oxide film 37 on the bottom of the columnar groove 36a is removed as shown in FIG. 4F, resulting in exposing the silicon substrate 33. Further, as shown in FIG. 4G, by anisotropically wet-etching the silicon substrate 33 with a KOH solution, a pyramidal groove 36b in the shape of an inverted truncated pyramid is formed in the silicon substrate 33 under the bottom of the columnar groove 36a.

Figure 4H:
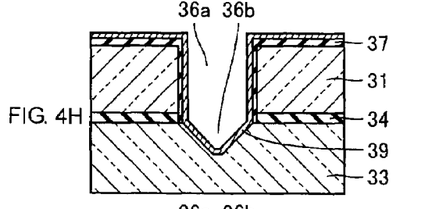
FIG. 4H illustrates the fabrication process of the probe needle shown in FIG. 1, and shows that a plating seed is formed on the walls of the columnar groove and the pyramidal groove.
Figure 4I:
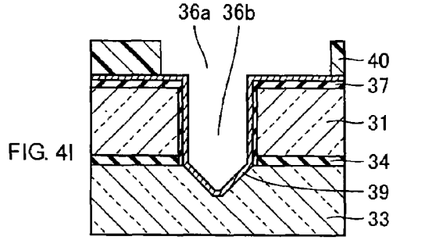
FIG. 4I illustrates the fabrication process of the probe needle shown in FIG. 1, and shows that a resist is formed on the plating seed.
Figure 4J:
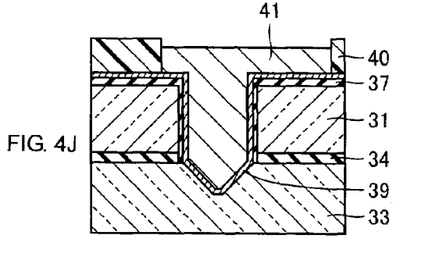
FIG. 4J illustrates the fabrication process of the probe needle shown in FIG. 1, and shows that a nickel alloy is deposited in the columnar groove and pyramidal groove.
Figure 4K:
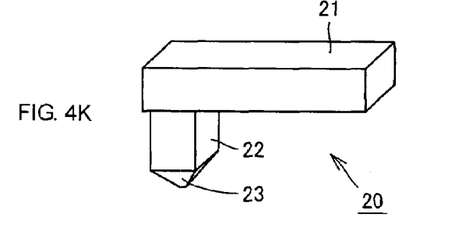
FIG. 4K is an external perspective view of the probe needle with the cantilever, column, and tip fabricated through the process shown in FIGS. 4A to 4J.

As shown in FIG. 4H, a plating seed 39 made of titanium oxide or copper oxide is formed on the oxide film 37, the walls of the columnar groove 36a, and the bottom of the pyramidal groove 36b in the shape of an inverted truncated pyramid by the CVD method. Further, as shown in FIG. 4I, a resist 40 is formed on the plating seed 39 using a lithography technique except for an area that will be the cantilever 21. Then, as shown in FIG. 4J, a nickel alloy 41, for example, is deposited in the area surrounded by the resist 40, the columnar groove 36a, and pyramidal groove 36b, and subsequently taken out from the silicon substrates 31, 33, other layers and films to complete a probe needle 20 having the cantilever 21, column 22, and tip 23 as shown in FIG. 4K.

As discussed above, according to the embodiment, the probe needle 20 having a relatively simple structure can be fabricated by forming the columnar groove 36a corresponding to column 22 by anisotropic dry etching, forming the pyramidal groove 36b corresponding to the tip 23 by anisotropic wet etching, and then filling the columnar groove 36a and pyramidal groove 36b with metal.

Although the column 22 and tip 23 are formed in the same process in the embodiment shown in FIGS. 4A to 4K, it is also possible to form only the tip 23 in another sacrificial substrate and then to adhere the tip 23 to the column 22.

FIGS. 5A to 5K illustrate a fabrication process of a probe needle according to another embodiment of the invention. In this embodiment, the column 22 is stepped so as to have a larger-diameter columnar portion and a smaller-diameter columnar portion.

Figure 5A:
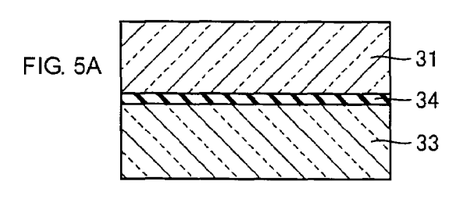
FIG. 5A illustrates a fabrication process of a probe needle according to another embodiment of the invention, and shows that a buried insulating layer is formed between silicon substrates.
Figure 5B:
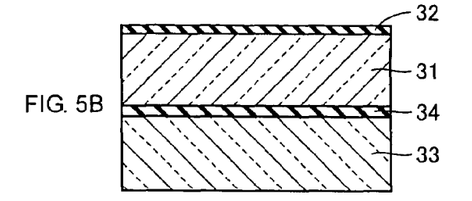
FIG. 5B illustrates the fabrication process of the probe needle according to another embodiment of the invention, and shows that an NSG film is formed on a silicon substrate.
Figure 5C:
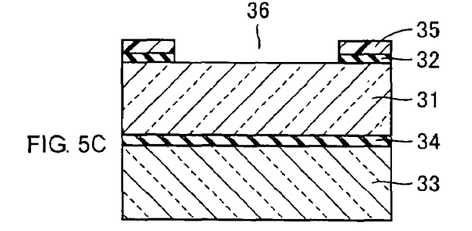
FIG. 5C illustrates the fabrication process of the probe needle according to another embodiment of the invention, and shows that an opening is formed in the resist film and NSG film.
Figure 5D:
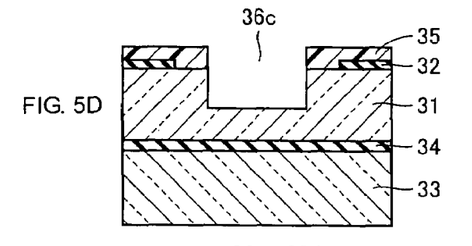
FIG. 5D illustrates the fabrication process of the probe needle according to another embodiment of the invention, and shows that a columnar groove is formed in the silicon substrate.

In FIG. 5A, a buried insulating layer 34 is formed between a silicon substrate 31 and silicon substrate 33. As shown in FIG. 5B, an NSG film 32 is formed on the silicon substrate 31 by the CVD method. After a resist film 35 is formed on the NSG film 32, the resist film 35 is exposed to light with a photomask and undergoes a development process. A quadrangular opening is formed in the resist film 35, and then a quadrangular opening 36 is formed in the NSG film 32 by anisotropic dry etching as shown in FIG. 5C. As shown in FIG. 5D, a resist film 35 is formed in the opening 36 except for an area that will be a columnar groove 36c having a smaller diameter than the width of the opening 36, and then the silicon substrate 31 is anisotropically dry-etched to form the columnar groove 36c having approximately half the depth of the silicon substrate 31.

Figure 5E:
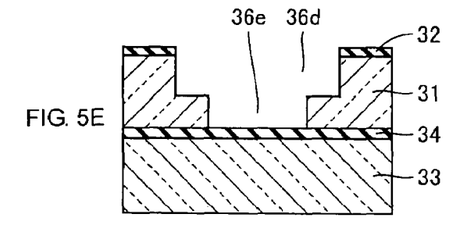
FIG. 5E illustrates the fabrication process of the probe needle according to another embodiment of the invention, and shows that the width and depth of the columnar groove are increased.
Figure 5F:
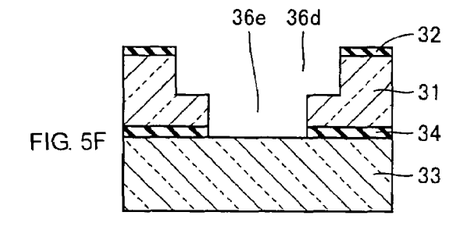
FIG. 5F illustrates the fabrication process of the probe needle according to another embodiment of the invention, and shows that the buried insulating layer just under the bottom of the columnar groove is removed.
Figure 5G:
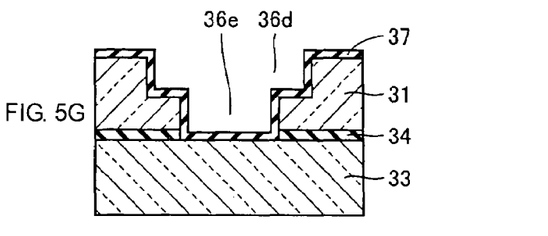
FIG. 5G illustrates the fabrication process of the probe needle according to another embodiment of the invention, and shows that an oxide film is formed on the silicon substrate and around the opening of the columnar groove, and on the walls and bottom of the columnar groove.
Figure 5H:
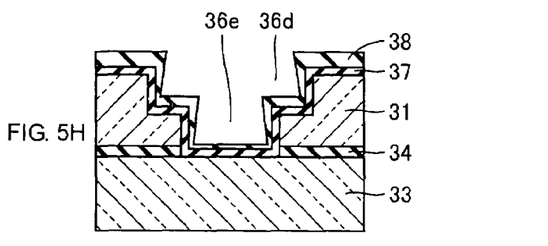
FIG. 5H illustrates the fabrication process of the probe needle according to another embodiment of the invention, and shows that an NSG film is formed on the oxide film.

Next, the resist film 35 is removed, and then, as shown in FIG. 5E, anisotropic dry etching is performed with the use of the NSG film 32 as a mask to deepen and widen the columnar groove 36c. As a result, a two-stepped groove is formed including a larger-diameter columnar groove 36d and a smaller-diameter columnar groove 36e thereunder. As shown in FIG. 5F, the buried insulating layer 34 under the bottom of the columnar groove 36e is removed by the anisotropic dry etching. As shown in FIG. 5G, an oxide film 37 is formed over the upper surface of the silicon substrate 31 and around the opening of the columnar groove 36d, the walls and bottoms. At this time, since the NSG film 32 shown in FIG. 5F is absorbed in the oxide film 37, the oxide film 37 positioned on the upper surface of the silicon substrate and around the opening of the columnar groove 36d becomes thicker. Further, as shown in FIG. 5H, an NSG film 38 is formed on the oxide film 37 by the CVD method. This NSG film 38 is so formed to be thicker around the opening of the larger-diameter columnar groove 36d and thinner at the bottom of the smaller-diameter columnar groove 36e.

Figure 5I:
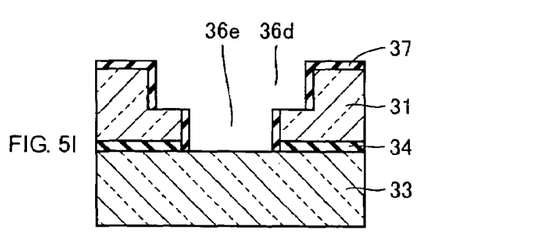
FIG. 5I illustrates the fabrication process of the probe needle according to another embodiment of the invention, and shows that the oxide film on the bottoms of a large columnar groove and small columnar groove is removed.
Figure 5J:
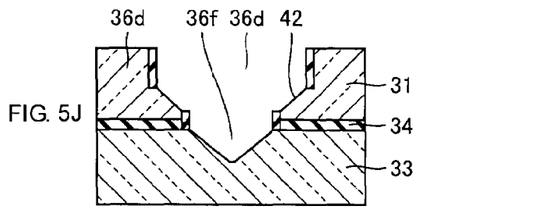
FIG. 5J illustrates the fabrication process of the probe needle according to another embodiment of the invention, and shows that an inclined surface is formed on the walls of the small columnar groove, and a pyramidal groove is formed under the bottom of the small columnar groove.

As shown in FIG. 5I, the anisotropic dry-etching is performed to remove the NSG film 38 as well as the oxide film 37 positioned at the bottom of the columnar groove 36d and at the bottom of the columnar groove 36e. As shown in FIG. 5J, the silicon substrates 31, 33 are anisotropically wet-etched with a KOH solution to form: an inclined surface 42, on the walls of the smaller-diameter columnar groove 36e in the silicon substrate 31, having an upper part equivalent to the width of the columnar groove 36d and a lower part equivalent to the width of the columnar groove 36e; and a pyramidal groove 36f in the shape of an inverted truncated pyramid in the silicon substrate 33. The larger-diameter columnar groove 36d and inclined surface 42 thereunder corresponds to a column 22a having a stepped part with different transverse sections in size, while the pyramidal groove 36f corresponds to the tip 23a.

Figure 5K:
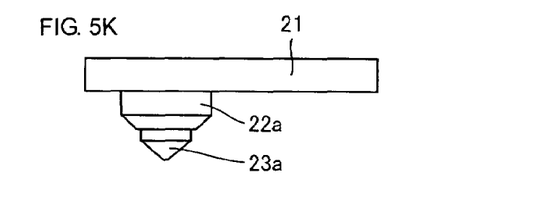
FIG. 5K illustrates the cantilever, column and tip fabricated through the process shown in FIGS. 5A to 5J.

After this, the same process shown in FIGS. 4H to 4K is performed. Thus, a nickel alloy, for example, is deposited in the columnar groove 36d and pyramidal groove 36f to complete a cantilever 21, column 22a and tip 23a continuously formed from the column 22a as shown in FIG. 5K.

In this embodiment, the stepped part having different transverse sections in size is formed in the column 22a, and the tip 23a is so formed as to continue from the stepped part, therefore the tip 23a can be tapered down to a narrower end, thereby allowing the tip 23a to precisely and reliably make contact with the electrode pads.

The foregoing has described the embodiments of the present invention by referring to the drawings. However the invention should not be limited to the illustrated embodiments. It should be appreciated that various modifications and changes can be made to the illustrated embodiments within the scope of the appended claims and their equivalents.

INDUSTRIAL APPLICABILITY

The present invention having a tip portion formed at a top end of a column portion of a probe can be utilized in a probe card having a plurality of probe needles corresponding to a plurality of electrode pads formed on an IC chip.

What is claimed is:

1. A method for fabricating a probe comprising the steps of
forming a columnar groove by anisotropically dry-etching the main surface of a substrate;
forming a conical or pyramidal groove having a tip with a flat surface by anisotropically wet-etching the bottom of said columnar groove; and
forming a contact of the probe having a tip with a flat surface by filling said conical or pyramidal groove and said columnar groove with metal.

2. The method for fabricating the probe according to claim 1, wherein
said substrate comprises a first substrate-material layer and a second substrate-material layer laminated with a boundary layer having a different etching rate, interposed therebetween;
said columnar groove is formed in said first substrate-material layer; and
said conical or pyramidal groove is formed in said second substrate-material layer.

3. The method for fabricating the probe according to claim 2, wherein
said boundary layer functions as an etching stopper upon the formation of said columnar groove.

4. The method for fabricating the probe according to claim 1, wherein
the step of forming said contact comprises a step of forming a plating seed on the walls of said columnar groove and the bottom of said conical or pyramidal groove, and subsequently depositing metal on the seed.

5. The method for fabricating the probe according to claim 1, wherein
the step of forming said columnar groove comprises the steps of:
forming a larger-diameter columnar groove having a relatively large diameter by anisotropically dry-etching the main surface of said substrate; and
forming a smaller-diameter columnar groove having a relatively small diameter by anisotropically dry-etching the bottom of said larger-diameter columnar groove.

6. The method for fabricating the probe according to claim 5, wherein
the step of forming the columnar groove further comprises a step of forming a conical or pyramidal inclined surface by anisotropic wet etching on an area for connecting the walls of said smaller-diameter columnar groove and the walls of said larger-diameter columnar groove.

* * * * *